United States Patent [19]

Doany

[11] Patent Number: 4,914,399
[45] Date of Patent: Apr. 3, 1990

[54] INDUCTION COIL DRIVER
[75] Inventor: Ziyad H. Doany, Austin, Tex.
[73] Assignee: Minnesota Mining and Manufacturing Company, St. Paul, Minn.
[21] Appl. No.: 317,820
[22] Filed: Mar. 1, 1989
[51] Int. Cl.$^4$ .............................................. H03F 3/38
[52] U.S. Cl. ....................................... 330/10; 330/251
[58] Field of Search ...................... 324/67; 330/10, 51, 330/207 A, 251, 277, 306

[56] References Cited

U.S. PATENT DOCUMENTS

| | | | |
|---|---|---|---|
| 4,119,908 | 10/1978 | Cosman et al. | 324/3 |
| 4,322,677 | 3/1982 | Wright | 324/52 |
| 4,334,227 | 6/1982 | Marks | 343/719 |
| 4,531,096 | 7/1985 | Yokoyama | 330/251 X |
| 4,712,094 | 12/1987 | Bolson Sr. | 340/572 |

FOREIGN PATENT DOCUMENTS 993516  7/1976  Canada ................................... 324/48

OTHER PUBLICATIONS

W. David Gregg–The University of Texas at Austin–Analog and Digital Communication–Copyright 1977.

3M Field Notes–3M Test & Measurement Systems–No. 16, (1987).

Primary Examiner—Steven Mottola
Attorney, Agent, or Firm—Donald M. Sell; Walter N. Kirn; Jack V. Musgrove

[57] ABSTRACT

An amplifier which has special application as an induction coil driver. A multi-frequency signal is used to modulate the pulse width of a square wave, resulting in a pulse modulated signal. The pulse modulated signal is divided into two delay signals. The falling edge of each pulse is delayed in one of the delay signals, while the rising edge of each pulse is delayed in the other delay signal. This creates a "dead band" between the two signals for each pulse. The signals are used to drive two metal oxide semiconducting field-effect transistors, which are connected to positive and negative power supplies. The switching of the MOSFETs occurs during the dead band which, when combined with a novel inductor-diode circuit, results in high-efficiency power transfer. The amplified modulated signal is then subjected to a low-pass filter which cancels out the square wave carrier and switching noise. The amplified analog signal may then be applied to a non-tuned induction coil.

18 Claims, 3 Drawing Sheets

INDUCTION COIL DRIVER

BACKGROUND OF THE INVENTION

1. Field of the Invention

The present invention generally relates to devices for producing electrical signals to be inductively coupled to a conductor, and more particularly to an amplifier having an application as a driver for an induction coil which may be used in locating buried cables and the like.

2. Description of the Prior Art

Induction coils are well known in the art, and are used to generate alternating currents or high voltage pulses in conductors, as well as to create high voltage signals from low-voltage current, as is accomplished in a standard transformer. The present invention is not directed to induction coils per se, but rather relates to circuits for driving such coils.

One particular application for induction coils relates to location of previously buried objects. It often becomes necessary to locate defective or damaged cables, pipes, etc., in order to repair or replace them. Conversely, it is important to know the approximate vicinity of such items in order to avoid disturbing them when digging or excavating for other purposes. Several methods employing inductive coupling of signals have been devised for searching for such objects.

For example, underground cables, such as telephone and CATV cables, surface at various locations in terminal boxes known as pedestals. An amplified signal source may be inductively coupled to a given wire or wire pair at the pedestal. The wire acts as an antenna, re-radiating the signal along the full length of the cable. A receiver unit may then be used above ground to trace the path of the buried cable.

It is possible to directly connect the signal source to the cable where a bare wire is exposed, but this is undesirable as it may result in interference with signals or conversations on the cable. Moreover, direct connection creates a potential shock hazard, and is further unsuitable in instances where no bare wire is exposed. Inductive coupling of the signal to the wire is thus preferable.

The assignee of the present invention, Minnesota Mining & Manufacturing Co. of St. Paul, Minn., markets several products which incorporate the latter technique. 3M's Dynatel 500 Cable Locator and Dynatel 573 Fault Locator each employ inductive coupling to send the source signal through the cable. The transmitter unit of these devices may simply be placed above the cable, as there is an internal antenna within the transmitter housing which acts as an inductive coil. Alternatively, 3M's Dyna-Coupler accessory may be used to isolate a single wire for inductive coupling ("Dynatel" and "Dyna-Coupler" are registered trademarks of 3M).

A similar technique employing inductive coupling is used in passive electronic marker systems. Passive markers are basically wire coils surrounded in a protective envelope, which are then buried adjacent the cable, pipe, or other object to be marked. There is no power supply in a passive marker, and they are self-contained, with no external, accessible connections. 3M markets several kinds of passive markers for different applications as part of its ScotchMark Electronic Marker System ("ScotchMark" is a registered trademark of 3M). Two of these markers are described in the following U.S. patents which are hereby incorporated by reference: U.S. Pat. Nos. 4,334,227 issued to B. Marks, and 4,712,094 issued to J. Bolson.

Passive markers are activated by radiating a signal toward the ground in the area where the marker is expected to be found. The signal is emitted via an inductive coil held very close to the surface. When the coil is directly over the passive marker (which is itself an inductive coil), a resonance is created, and the passive marker re-emits the signal. A second coil within the unit acts as a receiver, and detects the reradiated signal, alerting the service technician with an audible tone or other indicator means. A good explanation of one such transmitter/receiver device may be found in Canadian Pat. No. 993,516, hereby incorporated by reference, which is based on a U.S. patent application, Ser. No. 523,263 (filed Nov. 13, 1974), now abandoned.

Passive markers are usually color-coded according to the particular type of utility line they mark. Specifically, gas line markers are yellow; telephone cable markers are orange; sewage tunnel markers are green; water pipe markers are blue; and power supply markers are red. Similarly, the inductive coil in a passive marker is "coded" by tuning the coil for a specific resonant frequency. Five distinct frequencies have been designated: 83.0 kHz for gas; 101.4 kHz for telephone; 121.6 kHz for sewage; 145.7 kHz for water; and 169.8 kHz for power. In this manner, a service technician searching for, say, a gas line, cannot accidentally activate a telephone marker since his transmitter will only be sending out an 83 kHz signal which will not affect the telephone marker tuned for 101.4 kHz.

Although the foregoing convention for tuning markers has obvious advantages, it also creates several problems. First, it requires that the induction coil in the transmitter be tuned to same resonant frequency as that of the passive marker. Tuning the transmitter coil minimizes power losses in the transmitter and maximizes power output at the desired frequency. This is normally accomplished by including a variable capacitor in series with the transmitter's induction coil (forming an LC circuit). In so tuning the transmitter, however, the usefulness of the device becomes limited to that particular frequency. For example, suppose the service technician from the preceding paragraph wanted to search for both gas and telephone lines in the designated area. He would have to use two different transmitter/receivers, separately scanning the area, and thus doubling his effort. Transmitters have been designed which are capable of emitting more than one frequency to an induction coil. The two different frequencies are not, however, transmitted simultaneously.

FIG. 1 is a representation of a generalized prior art transmitter similar in nature to the Dynatel 500 and 573 Cable Locators. A switch 1 directs the appropriate frequency signal 2, 3 or 4 ($f_1$, $f_2$ or $f_3$) through a linear amplifier 5 to one of three induction coils 6, 7 and 8. Each induction coil is tuned by provision of separate LC circuits ($L_1C_1$, $L_2C_2$ and $L_3C_3$). Such a device is still inadequate with regard to detection of different frequency markers since it emits only a single-frequency signal at any given time. The transmitter of FIG. 1 could be altered to provide a multiple-frequency signal through a conventional linear amplifier(s) to all three coils simultaneously, or to simply provide the multiple-frequency signal to a single, non-tuned induction coil. In either case, however, power losses are excessive and unacceptable, in light of the fact that these units are typically portable with internal battery packs. Additionally, the presence of multiple coils creates interference or shorting therebetween causing additional power losses. It would, therefore, be desirable and advantageous to devise a driver for an induction coil which could simultaneously emit multiple frequencies with high efficiency power consumption.

Accordingly, the primary object of the present invention is to provide an amplifier having a particular application as a driver for an induction coil.

Another object of the invention is to provide such an induction coil driver which supplies a single- or multiple-frequency source.

Still another object of the invention is to provide an induction coil circuit which may drive the coil in a non-resonant mode.

Yet another object of the invention is to provide an induction coil driver with a high efficiency over a wide frequency range for use in a portable, battery-power supplied unit.

SUMMARY OF THE INVENTION

The foregoing objects are achieved in an induction coil driver which modulates the pulse width of a square wave carrier based on the frequencies from a signal source. The apparatus comprises a pulse width modulator connected to switching means responsive to the pulse modulated signal, the output of the switching means being filtered to remove the carrier frequency and switching noise.

The modulated square wave is divided into two signals which are conditioned to have the falling edge of one signal and the rising edge of the other signal delayed. This delay creates a dead band space between the modulated pulses enabling high-efficiency switching by a pair of MOSFETs acting as a class D amplifier. The MOSFETs, together with the inductors in a low-pass filter, provide high efficiency power consumption as energy is transferred between the inductor and the power supply with very little power loss.

BRIEF DESCRIPTION OF THE DRAWINGS

The novel features of the invention are set forth in the appended claims. The invention itself, however, will best be understood by reference to the accompanying drawings, wherein:

DESCRIPTION OF THE PREFERRED EMBODIMENT

Figure 2:
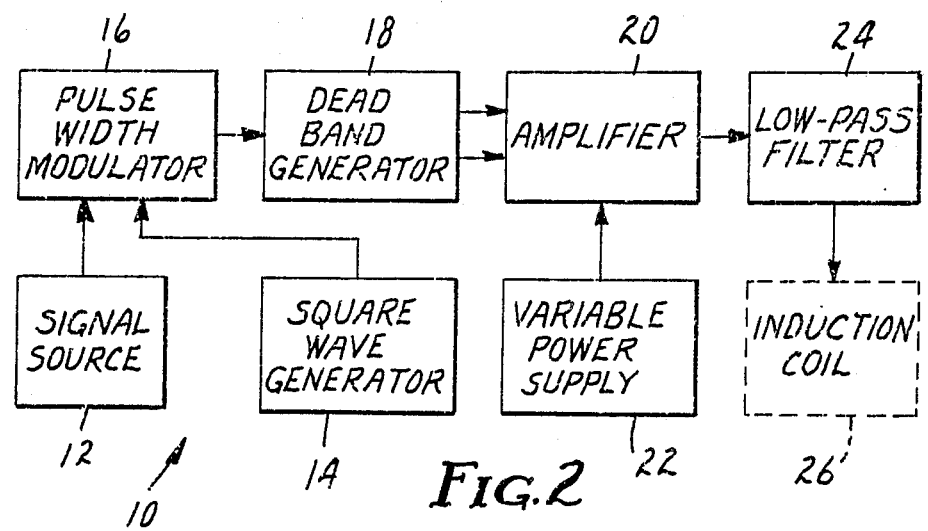
FIG. 2 is a block diagram of the induction coil driver of the present invention.
Figure 1:
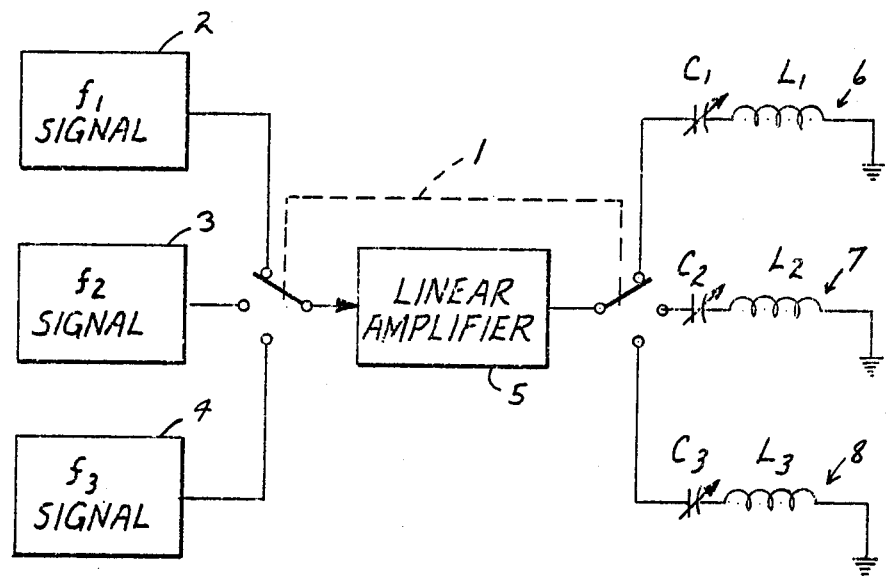
FIG. 1 is a schematic diagram of a generalized prior art transmitter having selectable induction coils tuned at different frequencies.

With reference now the figures, and in particular with reference to FIG. 2, there is depicted a block diagram of the induction coil driver 10 of the present invention. Induction coil driver 10 is generally comprised of signal source 12, square wave generator 14, pulse width modulator 16, dead band generator 18, amplifier 20, low-pass filter 24 and induction coil 26.

The inventor prefers to use a direct digital synthesizer for signal source 12. Other signal generators, such as a sine wave oscillator, may be used. As discussed further below, signal source 12 may emit multi-frequency signals. Square wave generator 14 is conventional, and should generate a frequency much higher than the highest frequency component in the signal source, preferably by a factor of five or more, in order to reduce signal distortion and simplify the use of low-pass filter 24. For the specific application of cable and marker locating (a frequency range of approximately 50 kHz to 200 kHz), the inventor has found a square wave of about 500 kilohertz acceptable, which results in a carrier output from pulse width modulator 16 of about one megahertz.

The pulse widths of the square wave relayed by square wave generator 14 are modulated by the signal from signal source 12 by means of pulse width modulator 16. In the preferred embodiment, pulse width modulator 16 is a phase-locked loop circuit; other techniques may be utilized. Basically, the pulse duration of the square wave is decreased by a positive amplitude at signal source 12 and is increased by a negative amplitude at signal source 12. Those skilled in the art will appreciate that the inverse operation would work equally well.

The pulse modulated signal is directed from pulse width modulator 16 to dead band generator 18, where two complimentary, pulse modulated signals are created. These signals are virtually the same as the pulse modulated signal except that the falling edge of one signal has been slightly delayed, while the rising edge of the second signal is slightly delayed. These delays complement one another by creating a space or "dead band" which optimizes switching in amplifier 20 between positive and negative power supplies. Amplifier 20 is essentially a class D amplifier utilizing a pair of MOSFETs, and is discussed in more detail in conjunction with FIG. 3 below.

A variable power supply 22 may optionally be provided for amplifier 20, for controlled power output of induction coil driver 10. Variable power supplies are known in the art. A programmable high-voltage supply, optimally set at ±50 volts, is preferred. It should be noted that dead band generator 18 and amplifier 20, in combination, may be regarded as switching means responsive to the pulse modulated signal which produces an amplified modulated signal.

The output of amplifier 20, still a pulse modulated (digital) signal, is fed to low-pass filter 24 which filters out the one megahertz pulses and noise from the switches in amplifier 20. The signal is now analog but has much higher voltage compared to the original signal source. It drives a conventional induction coil(s) 26 which transmits an amplified version of the original signal from signal source 12 to a nearby conductor, such as a telephone cable.

Figure 4:
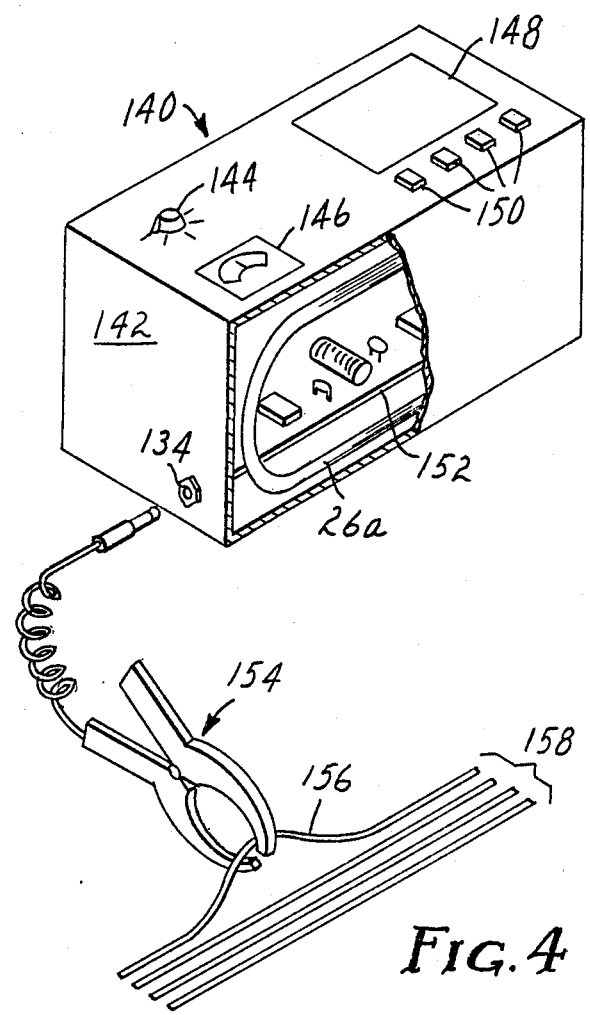
FIG. 4 is a perspective view of the transmitter embodiment of the present invention.

The dashed line delimiting induction coil 26 in FIG. 2 signifies that induction coil 26 is not technically part of the present invention, but merely is an appurtenant structure to the particular embodiment depicted. As discussed above in the Description of the Prior Art, induction coil 26 may take the form of an antenna within the housing of a transmitter unit, or a remote inductive coupler (as shown in FIG. 4).

Figure 3:
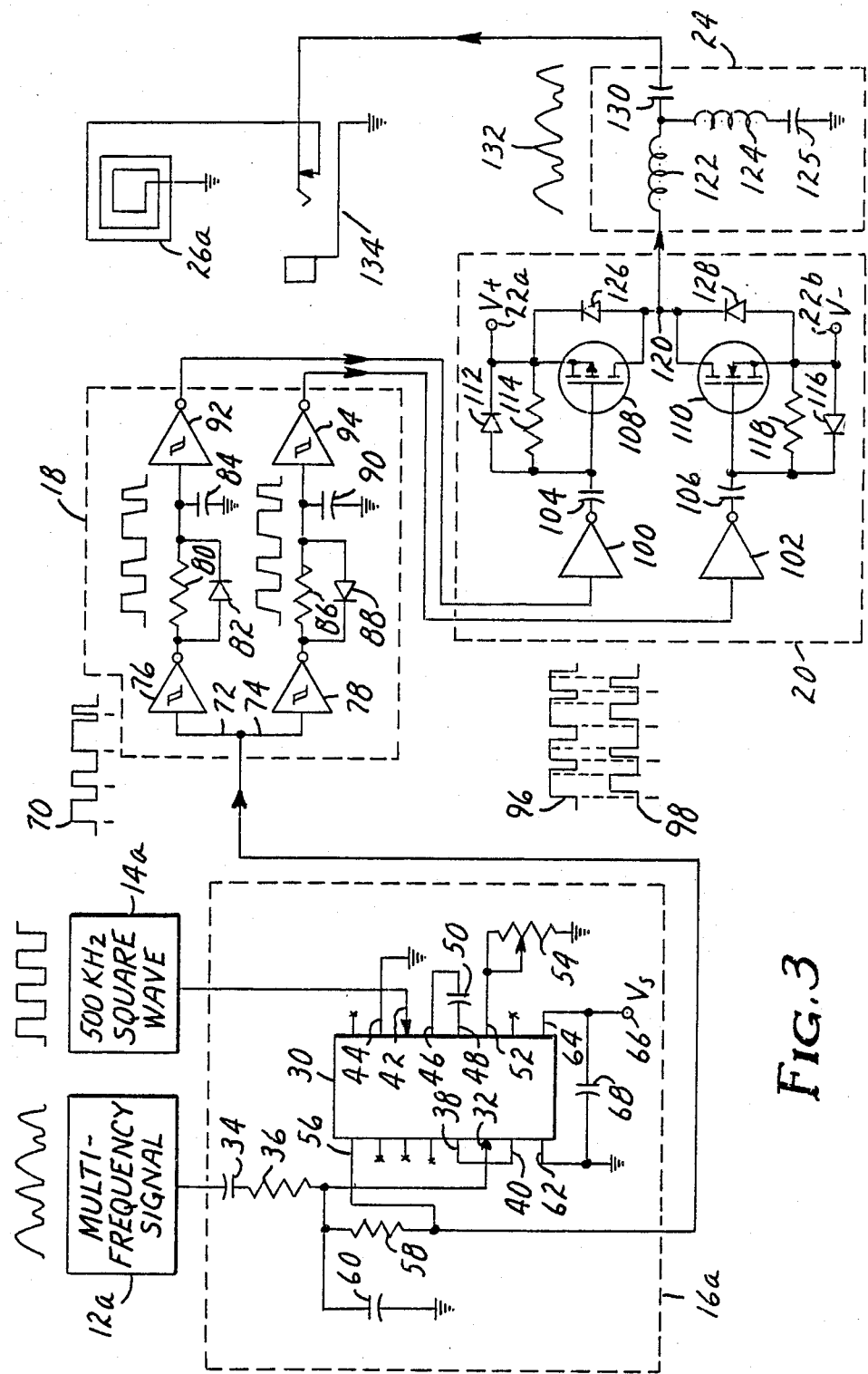
FIG. 3 is a schematic diagram showing details of the circuitry of the present invention.

With further reference to FIG. 3, a detailed electrical schematic of the induction coil driver embodiment 10 of the present invention is explained. As noted above, the preferred embodiment includes a multifrequency (analog) signal 12a in place of signal source 12, with peak-to-peak amplitude of approximately four volts. Also, the signal from square wave generator 14 is a 500 kHz square wave 14a (preferably between zero and five volts). Signals from both of these sources lead to a phase-locked loop circuit 16a.

As previously noted, phase-locked loop circuits are known. The preferred embodiment utilizes an integrated circuit (IC) chip 30 known in the art as a 74HC4046, available from vendors such as Motorola and National Semiconductor. Lead 32 corresponds to pin number 9 on a 74HC4046, the standard input to an internal voltage-controlled oscillator. Multi-frequency signal 12a is connected to lead 32 via summing capacitor 34 and summing resistor 36. Leads 38 and 40 (corresponding to pin numbers 4 and 3, respectively, on a 74HC4046) are connected to one another, and direct the output from the voltage controlled oscillator to the input of an internal comparator (XOR).

Lead 42 (corresponding to pin number 14 on a 74HC4046) is the primary input for chip 30, and is connected to the 500 kHz square wave 14a. Lead 44 (corresponding to pin number 5 on a 74HC4046) is the inhibit control, and is shunted to ground. Leads 46 and 48 (corresponding to pins 6 and 7, respectively, on a 74HC4046) are connected to capacitor 50 which controls the frequency response of the internal voltage controlled oscillator. The inventor has found that capacitor 50 should have a capacitance of approximately 800 picofarads for the purposes disclosed herein. Lead 52 (corresponding to pin number 11 on a 74HC4046) also relates to the voltage controlled oscillator, and is connected to a variable resistor 54. Variable resistor 54 should optimally be set to provide a fifty percent (50%) duty cycle at the comparator output of phase-locked loop 16a with no modulation. For the circuit shown in FIG. 3, variable resistor 54 should be approximately 20 k$\Omega$.

Lead 56 is the output of IC chip 30, and it is also connected via resistor 58 to the voltage-controlled oscillator input lead 32. The voltage-controlled oscillator is normally the output of a phase-locked loop circuit, but here, acting as a pulse width modulator, the output (lead 56) is from the comparator. Resistor 58 and capacitor 60 provide integration of the error signal for phase-locked loop circuit 16a. Power for chip 30 is supplied via leads 62 and 64 (pin numbers 8 and 16, respectively, on a 74HC4046), which are connected to ground and supply terminal 66, respectively. The supply voltage $V_s$ is preferably 5 volts DC. Supply terminal 66 is also connected to ground via capacitor which smoothes out the supply voltage $V_s$. The remaining leads on chip 30 (shown with open terminations) are not necessary for the purposes described herein.

The comparator output of phase-locked loop circuit 16a, the pulse modulated signal, is the input to dead band generator 18. The signal trace 70 adjacent block 18 on FIG. 3 illustrates the modulation of the pulse widths of the square wave signal. Some pulses are longer than others, but the cycle time between pulses, highlighted by the hash marks under signal trace (at the rising edge), remains constant. Based on the 500 kHz input to phase-locked loop circuit 16a, the frequency of signal 70 is about one megahertz, so the pulse duration (with no modulation) is about 500 nanoseconds. Either the rising edge or the falling edge of the signal may be modulated. In the embodiment depicted, modulation occurs at the falling edge; the signal varies between zero and five 5 volts ($V_s$).

Pulse modulated signal 70 is divided into two channels 72 and 74 in dead band generator 18. Inasmuch as the channels lead to a p-MOSFET and an n-MOSFET, respectively, it is convenient to refer to them as p-channel 72 and n-channel 74. Both channels first pass through Schmitt triggers 76 and 78 to delay networks.

The output of Schmitt trigger 76 is connected to a resistor 80 and diode 82 in parallel, and then to a capacitor 84. Diode 82 passes only positive voltage. The result is a signal similar to pulse width modulated signal 70 but with a ramped falling edge. Similarly, the output of Schmitt trigger 78 is connected to resistor 86 and diode 88 in parallel, and then to capacitor 90, but diode 88 passes only negative voltage. In this manner, the n-channel signal has a ramped rising edge. The width of the ramps, or delay time, is a function of the RC constants of the resistor-capacitor pairs formed by resistor 80 and capacitor 84, and resistor 86 and capacitor 90. The time delay should be on the order of the switching time of the MOSFETs described below in amplifier 20. It should also be much smaller than the pulse width of signal 70. For the previously enumerated values of parameters in the illustrative embodiment, a delay of approximately 25 nanoseconds is optimal.

After passage of each of these signals through a second set of Schmitt triggers 92 and 94, two delay signals are created, which have delayed rising and falling edges. As those skilled in the art will appreciate, Schmitt triggers 92 and 94 act to square-off the ramped signals. In contrast, Schmitt triggers 76 and 78 merely act as buffers for the delay networks and may be replaced by inverters; they are, however, conveniently available in a 6-trigger dual-inline-package commonly known as a 74HC14.

When the delay signals pass through inverters 100 and 102, they appear as signals 96 and 98 as illustrated in FIG. 3. It will be appreciated that the delay in signals 96 and 98 as shown are exaggerated for purposes of explanation. The average pulse width (500 ns) is about twenty times the size of the delay (25 ns). The pulses in delay signals 96 and 98 correspond to the pulses in modulated signal 70, i.e., the first pulse in delay signal 96 and the first pulse in delay signal 98 are essentially identical to the first pulse in modulated signal 70, with the exception of the delayed rising/falling edges.

P-channel delay signal 96 and n-channel delay signal 98 are coupled to the source reference voltage of amplifier 20 by means of capacitors 104 and 106. Inverters 100 and 102 act as drivers for a pair of metal oxide semiconducting field-effect transistors (MOSFETs) 108 and 110, and raise the peak voltage of delay signals 96 and 98 to 10 volts. The particular inverters utilized by the inventor are sold by Maxim Co. under the model number MAX626. In the preferred embodiment, MOSFET 108 is a p-type field-effect transistor, While MOSFET 110 is an n-type.

The source lead of MOSFET 108 is connected to a positive voltage supply V+ which may be the positive rail 22a of variable power supply 22. A supply of about fifty volts is adequate for driving the induction coil employed in the anticipated application. Diode 112 and resistor 114, connected in parallel with the gate and source leads of MOSFET 108, clamp the gate-source voltage to the diode voltage, or about one volt (above V+). Similarly, the source lead of MOSFET 110 is connected to a negative voltage supply V− which may be the negative rail 22b of variable power supply 22, optimally set at minus fifty volts. Diode 116 and resistor 118 also clamp the gate-source voltage of MOSFET 110 to about one volt (below V−).

The drains of MOSFET 108 and MOSFET 110 are connected at node 120; however, due to the overlap of pulses between delay signal 96 and delay signal 98, a given MOSFET is allowed to turn off before the other one turns on. The switching time of the MOSFETs is about 25 ns, which is also the approximate dead band time. This effect, when combined with the inductors in low-pass filter 24, provides power transfer with practically no energy loss (explained further below). MOSFETs 108 and 110 are basically high-efficiency switches, and could be exchanged with alternate components, such as bipolar transistors. Also, the P/N channel combination could be replaced by a P/P channel combination or an N/N channel combination.

The output of amplifier 20, an amplified modulated signal, leads to low-pass filter 24 which is essentially comprised of two inductors 122 and 124, and a capacitor 125. In addition to filtering out the one megahertz square wave and switching noise from amplifier 20, inductors 122 and 124 help minimize power losses due to switching. This may be understood by examination of a full cycle of output at node 120.

At first, MOSFET 108 is activated, raising the output to V+ for the duration of the first pulse, and energizing inductors 122 and 124. When MOSFET 108 is turned off, a negative voltage is induced at node 120. The energy stored in the inductors would normally be dissipated as heat, but a diode (rectifier) 128 directs the energy back to negative rail 22b, i.e., creates zero power supply current. Then, after the dead band delay, MOSFET 110 is activated, similarly energizing the inductors (with reverse polarity), and changing the output to V−. When MOSFET 110 is turned off, the inductive energy is directed back to positive rail 22a via diode 126. Of course, current never flows directly from V+ to V− as the MOSFETs are never simultaneously activated.

A capacitor 130 is added to low-pass filter 24 to remove any DC bias from the filtered signal. The amplified analog signal 132, shown adjacent box 24 on FIG. 3, is essentially identical to the original multi-frequency signal 12a, except that its peak-to-peak voltage now varies between V+ and V− (actually, due to optimal 80% modulation, the voltage varies between 80% of V+ and V−). The signal may be directed to an antenna 26a acting as an inductive coil, or may be detoured to a remote coil by means of a switching phone jack 134.

Referring now to FIG. 4, a perspective view of a transmitter unit 140 incorporating the induction coil driver 10 is shown. Transmitter unit 140 includes housing 142, output control switch 144, output meter 146, display 148, and keys 150. Output control switch 144 sets V+ and V− via variable power supply 22. Output meter 146 is optional and merely measures the r.m.s. voltage (or current) of output signal 132. Display 148 may be utilized in conjunction with logic circuitry (beyond the scope of the present invention) to set the frequencies of multi-frequency signal 12a.

The cutaway in housing 142 reveals a printed circuit board 152 for receiving the various components of induction coil driver 10, and also reveals antenna 26a, placed at the side of unit 140 to facilitate its use as an inductive coil. A remote inductive coupler 154 is also shown adjacent switching phone jack 134, illustrating its use on a single wire 156 in cable group 158. It is further understood that unit 140 includes a conventional portable power supply or battery pack (not shown), although an adapter could be provided for connection to an external power source.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention has application as a high-efficiency driver for a capacitive load, such as is used in locating capacitive faults in cables, although in this use the connection would be direct rather than inductive. It is therefore contemplated that the appended claims will cover such modifications that fall within the true scope of the invention.

I claim:

1. An apparatus for amplifying an analog signal, comprising:
    means for generating a pulse modulated signal having pulse widths which are a function of the analog signal;
    means for creating first and second delay signals from said pulse modulated signal, each of said delay signals having pulses therein corresponding to pulses in said pulse modulated signal, the falling edge of each said pulse in said first delay signal being delayed, and the rising edge of each said pulse in said second delay signal being delayed, thereby creating a dead band between said first and second delay signals for each said pulse;
    a first switch having an output responsive to said first delay signal;
    a second switch having an output responsive to said second delay signal;
    power supply means connected to said outputs of said first and second switches; and
    low-pass filter means connected to said outputs of said first and second switches.

2. The apparatus of claim 1 wherein:
    said low-pass filter includes at least one inductor; and
    said switching means further includes rectifier means for returning inductive energy in said inductor to said power supply means during said dead band.

3. The apparatus of claim 2 wherein said means for generating a pulse modulated signal comprises:
    phase-locked loop circuit means responsive to the analog signal; and
    means for providing a square wave as a primary input to said phase-locked loop circuit means.

4. The apparatus of claim 3 wherein said means for creating first and second delay signals comprises:
    first and second delay networks connected in series with to the output of said phase-locked loop circuit means, said first delay network producing a ramped falling edge signal, and said second delay network producing a ramped rising edge signal; and
    means for squaring off said ramped falling edge signal and said ramped rising edge signal.

5. The apparatus of claim 4 wherein:
    said first switch is a p-type MOSFET whose source lead is connected to a positive rail of said power supply means; and
    said second switch is an n-type MOSFET whose source lead is connected to a negative rail of said power supply means.

6. The apparatus of claim 1 wherein said means for generating a pulse modulated signal comprises:

phase-locked loop circuit means responsive to the analog signal; and means for providing a square wave as a primary input to said phase-locked loop circuit means.

7. The apparatus of claim 1 wherein the output of said means for generating a pulse modulated signal is connected in series with to first and second delay networks, said first delay network producing a ramped falling edge signal, and said second delay network producing a ramped rising edge signal, and further comprising means for squaring off said ramped falling edge signal and said ramped rising edge signal.

8. The apparatus of claim 1 wherein:
said first switch is a p-type MOSFET whose source lead is connected to a positive rail of said power supply means; and
said second switch is an n-type MOSFET whose source lead is connected to a negative rail of said power supply means.

9. An apparatus for driving an induction coil, comprising:
means for producing an analog signal having one or more frequencies therein;
means for generating a pulse modulated signal having pulse widths which are a function of said analog signal;
means for creating first and second delay signals from said pulse modulated signal, each of said delay signals having pulses therein corresponding to pulses in said pulse modulated signal;
a first switch responsive to said first delay signal;
a second switch responsive to said second delay signal, the output of said first and second switches being combined to form an amplified modulated signal;
power supply means for regulating output of said first and second switches; and
low-pass filter means for converting said amplified modulated signal into an amplified analog signal, to be transmitted to the induction coil.

10. The apparatus of claim 9 wherein said means for creating first and second delay signals comprises:
first and second delay networks connected in series with to the output of said means for producing a pulse modulated signal, said first delay network producing a ramped falling edge signal, and said second delay network producing a ramped rising edge signal; and
means for squaring off said ramped falling edge signal and said ramped rising edge signal whereby the falling edge of each said pulse in said first delay signal is delayed, and the rising edge of each said pulse in said second delay signal is delayed, thereby creating a dead band between said first and second delay signals for each said pulse.

11. The apparatus of claim 10 wherein:
said low-pass filter includes at least one inductor; and
said first and second switches are connected, respectively, to first and second rectifier means for returning inductive energy in said inductor to said power supply means during said dead band.

12. The apparatus of claim 11 wherein said means for generating a pulse modulated signal comprises:
a phase-locked loop circuit responsive to said analog signal; and
a square wave source connected to the primary input of said phase-locked loop circuit.

13. The apparatus of claim 12 wherein:
said first switch is a p-type MOSFET whose source lead is connected to a positive rail of said power supply means; and
said second switch is an n-type MOSFET whose source lead is connected to a negative rail of said power supply means, the drains of each said MOSFET being connected, resulting in said amplified modulated signal.

14. An inductive transmitter comprising:
a signal source for producing an analog signal having one or more frequencies therein;
a square wave generator;
a pulse width modulator connected to said signal source and said square wave generator for generating a pulse modulated signal having pulse widths which are a function of said analog signal;
first and second delay networks connected in series with the output of said pulse width modulator, said first delay network producing a ramped falling edge signal, and said second delay network producing a ramped rising edge signal;
means for squaring off said ramped falling edge signal and said ramped rising edge signal, forming first and second delay signals, the falling edge of each pulse in said first delay signal being delayed, and the rising edge of each pulse in said second delay signal being delayed, thereby creating a dead band between said first and second delay signals for each said pulse;
a power supply having positive and negative rails;
a first switch responsive to said first delay signal, the input of said first switch being connected to said positive rail of said power supply;
a second witch responsive to said second delay signal, the input of said second switch being connected to said negative rail of said power supply, and the output of said first and second switches being combined to form an amplified modulated signal;
a low-pass filter connected to said combined output of said first and second switches for converting said amplified modulated signal into an amplified analog signal, said low-pass filter having at least one inductor;
first rectifier means connected to said first switch;
second rectifier means connected to said second switch, each of said rectifier means alternately returning inductive energy in said inductor to said power supply during successive dead bands; and
induction coil means connected to the output of said low-pass filter.

15. The inductive transmitter of claim 14 wherein:
said pulse width modulator comprises a phase-locked loop circuit;
said means for squaring off said ramped falling edge signal and said ramped rising edge signal comprises first and second Schmitt triggers, said first Schmitt trigger being connected to said first delay network, and said second Schmitt trigger being connected to said second delay network;
said first switch is a p-type MOSFET whose source lead is connected to said positive rail of said power supply; and
said second switch is an n-type MOSFET whose source lead is connected to said negative rail of said power supply, the drains of each said MOSFET being connected together to form said combined output.

16. The inductive transmitter of claim 14 wherein:

said one or more frequencies in said analog signal lie in the range of approximately 50 kHz to 200 kHz;

said square wave generator generates a square wave having a frequency of approximately 500 kHz; and said pulses in said first and second delay signals each have a delay time of approximately 25 nanoseconds.

17. A method of amplifying an analog signal comprising the steps of:

modulating a square wave to produce a pulse modulated signal having pulse widths which are a function of the analog signal;

creating first and second delay signals from said pulse modulated signal, each of said delay signals having pulses therein corresponding to pulses in said pulse modulated signal, the falling edge of each said pulse in said first delay signal being delayed, and the rising edge of each said pulse in said second delay signal being delayed, thereby creating a dead band between said first and second delay signals for each said pulse;

utilizing said first and second delay signals to regulate first and second switches, respectively, the input of said first switch being connected to a positive voltage supply, the input of said second switch being connected to a negative voltage supply, and the outputs of each of said switches being combined to produce an amplified modulated signal; and passing said amplified modulated signal through a low-pass filter, thereby generating an amplified analog signal.

18. The method of claim 17 further comprising the step of applying said amplified analog signal to induction coil means.

* * * * *